(12) United States Patent
Hosoda et al.

(10) Patent No.: US 6,797,560 B2
(45) Date of Patent: Sep. 28, 2004

(54) METHOD OF MANUFACTURING A CAPACITOR HAVING TANTALUM OXIDE FILM AS AN INSULATING FILM

(75) Inventors: Keizo Hosoda, Kitasoma-gun (JP); Yusuke Muraki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 8 days.

(21) Appl. No.: 09/859,513

(22) Filed: May 18, 2001

(65) Prior Publication Data

US 2001/0055821 A1 Dec. 27, 2001

(30) Foreign Application Priority Data

May 22, 2000 (JP) ........................................ 2000-149988

(51) Int. Cl.$^7$ ........................................... H01L 21/8242
(52) U.S. Cl. ...................................... 438/240; 438/381
(58) Field of Search ................................ 438/240, 239, 438/393, 171, 191, 329, 648, 650, 683, 685, 688; 257/296, 310, 379, 532, 528

(56) References Cited

U.S. PATENT DOCUMENTS

| | | | | |
|---|---|---|---|---|
| 4,851,370 A | * | 7/1989 | Doklan et al. | 437/225 |
| 5,352,623 A | * | 10/1994 | Kamiyama | 437/52 |
| 5,468,687 A | * | 11/1995 | Carl et al. | 437/235 |
| 5,521,423 A | * | 5/1996 | Shiriki et al. | 257/530 |
| 6,475,854 B2 | * | 11/2002 | Narwankar et al. | 438/238 |

* cited by examiner

*Primary Examiner*—W. David Coleman
(74) *Attorney, Agent, or Firm*—Oblon, Spivak, McClelland, Maier & Neustadt, P.C.

(57) ABSTRACT

A tantalum oxide film is formed on a lower conductive film by vapor-deposition, and then is treated with active oxygen species. The treated film is annealed at a temperature lower than the crystallization temperature of tantalum oxide by 10 to 80° C. in an inert atmosphere. Subsequently, an upper conductive film is formed on the annealed tantalum oxide film.

16 Claims, 4 Drawing Sheets

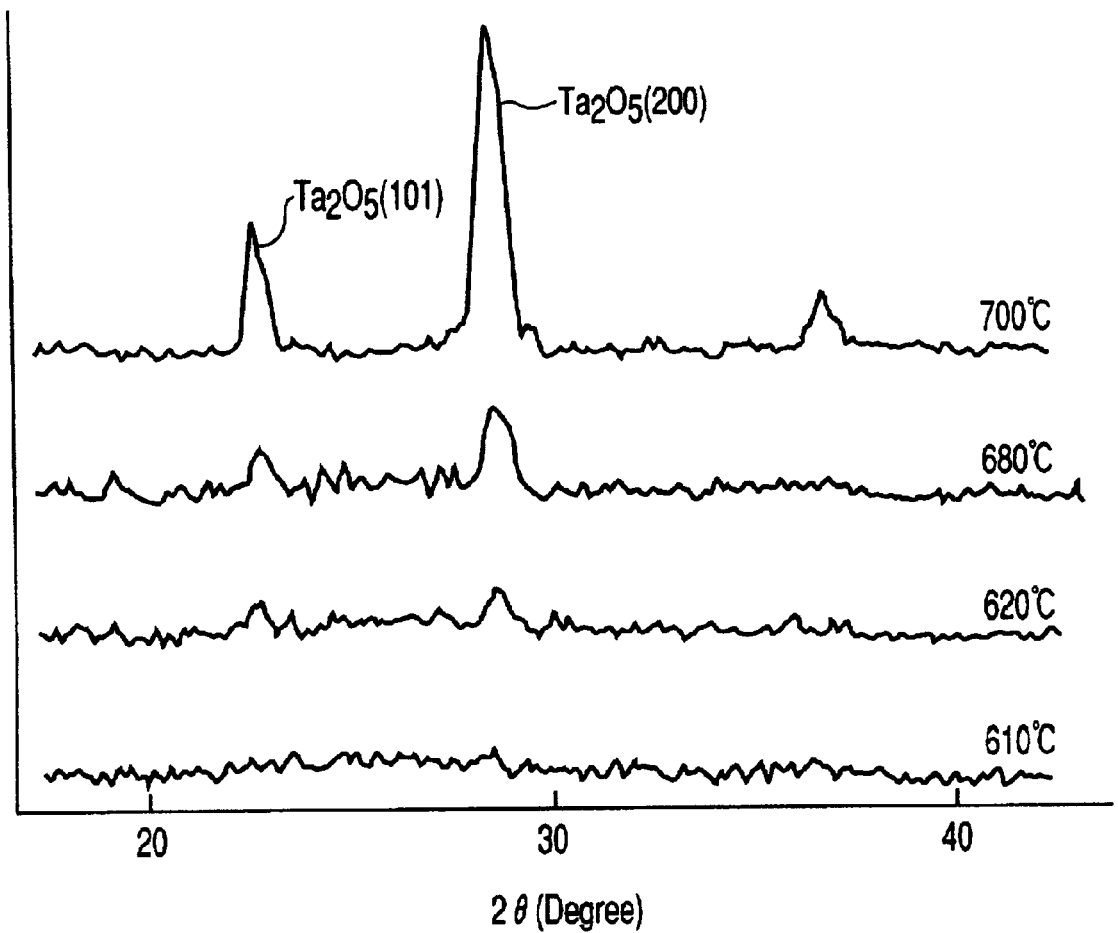
F I G. 5

METHOD OF MANUFACTURING A CAPACITOR HAVING TANTALUM OXIDE FILM AS AN INSULATING FILM

However, while the dielectric constant of tantalum oxide is increased when the oxide is crystallized, the annealing treatment for crystallizing tantalum oxide is accompanied by a problem of oxidation of the lower electrode of the capacitor.

More specifically, the tantalum oxide formed by a vapor-phase deposition method such as CVD is in an amorphous state and, if it is subjected to an annealing treatment for crystallization at a temperature higher than about 700° C., it releases some oxygen contained therein. As a result, the tantalum oxide becomes deficient of oxygen to consequently reduce its insulating effect and, at the same time, the lower electrode is oxidized by the oxygen that is released from the tantalum oxide. In the case where the lower electrode is formed of polysilicon, silicon oxide ($SiO_2$) is produced by the oxidation to compensate for the crystal defects of the tantalum oxide to some extent and suppress reduction in the insulating effect, although the capacitance of the capacitor is inevitably lowered. On the other hand, where the lower electrode is formed of a metallic material, electric leakage can easily occur because no high quality metal oxide is uniformly produced unlike the case of using polysilicon for the lower electrode.

BRIEF SUMMARY OF THE INVENTION

Therefore, it is an object of the present invention to provide a method of manufacturing a capacitor that can suppress the oxidation of the lower electrode and, at the same time, improve the quality of the tantalum oxide film.

As a result of a series of intensive research efforts for achieving the above object, the inventors of the present invention have found that the oxidation of the lower electrode can be minimized and the density of the tantalum oxide can be increased to improve the capacity of the capacitor and prevent electric leakage from taking place, by compensating for the oxygen deficiency of the tantalum oxide by means of a treatment with active oxygen species and conducting the annealing at a temperature lower than the crystallization temperature of tantalum oxide by 10° C. to 80° C. The present invention is based on these findings.

According to a first aspect of the present invention, there is provided a method of manufacturing a capacitor having a tantalum oxide film as insulating film, the method comprising: vapor-phase depositing a tantalum oxide film on a lower conductive film; treating the tantalum oxide film with active oxygen species; annealing the tantalum oxide film treated with the active oxygen species, at a temperature lower than the crystallization temperature of tantalum oxide by 10° C. to 80° C. in an inert atmosphere; and forming an upper conductive film on the annealed tantalum oxide film.

According to a second aspect of the invention, there is provided a method of manufacturing a capacitor having a tantalum oxide film as insulating film, the method comprising vapor-phase depositing a tantalum oxide film on a lower conductive film; annealing the tantalum oxide film at a temperature lower than the crystallization temperature of tantalum oxide by 10° C. to 80° C. in an inert atmosphere; treating the annealed tantalum oxide film with active oxygen species; and forming an upper conductive film on the tantalum oxide film treated with the active oxygen species.

In the first and second aspects of the present invention, the annealing step is preferably conducted at a temperature of from about 620° C. to about 690° C.

According to a third aspect of the invention, there is provided a method of manufacturing a capacitor having a tantalum oxide film as insulating film, the method comprising: a first vapor-phase deposition step of vapor-phase depositing a first tantalum oxide film on a lower conductive film; a first annealing step of annealing the first tantalum oxide film at a temperature lower than the crystallization temperature of tantalum oxide by 10° C. to 80° C. in an inert atmosphere; a first treatment step of treating the annealed first tantalum oxide film with active oxygen species; a second vapor-phase deposition step of vapor-phase depositing a second tantalum oxide film on the first tantalum oxide film treated with active oxygen species; a second treatment step of treating the second tantalum oxide film with active oxygen species; a second annealing step of annealing the second tantalum oxide film treated with the active oxygen species, within a temperature range between a temperature lower than the crystallization temperature of tantalum oxide by 10° C. to 80° C. and a temperature at which the tantalum oxide crystallizes, in an inert atmosphere; and a step of forming an upper conductive film on the annealed second tantalum oxide film;

wherein the step of forming the second tantalum oxide film, the subsequent second treatment step with active oxygen species and the second annealing step are conducted sequentially at least once, before the formation of the upper conductive film.

Preferably, the first annealing step is conducted at a temperature between about 620° C. and about 690° C. and the second annealing step is conducted at a temperature between about 650° C. and about 750° C.

In the invention, the lower electrically conductive film may be formed of a metal-based electrically conductive material such as ruthenium, tungsten, aluminium, platinum, tungsten nitride, titanium nitride, or titanium silicon nitride.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a graph showing X-ray diffraction measurement made on tantalum oxide annealed at different temperatures.

DETAILED DESCRIPTION OF THE INVENTION

Figure 1:
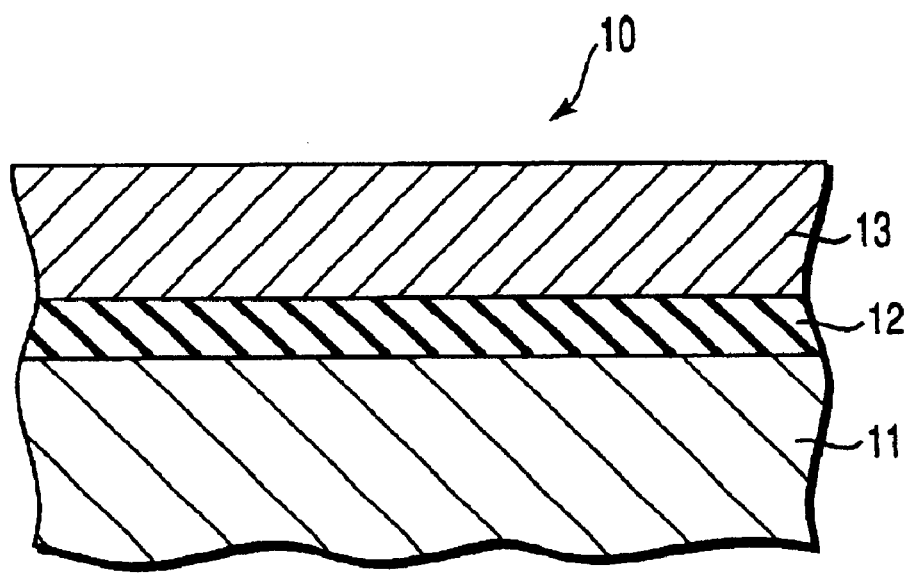
FIG. 1 is a schematic cross sectional view of a capacitor that can be manufactured by a method according to the invention.

The present invention will now be described with reference to the accompanying drawing. Throughout the FIGURES, same elements are denoted by same reference numerals.

FIG. 1 is a schematic cross sectional view of a capacitor that can be manufactured by a method according to the invention. Referring to FIG. 1, a capacitor 10 comprises a lower electrically conductive film 11, a tantalum oxide film 12 formed thereon and an upper electrically conductive film 13 formed on the tantalum oxide film 12.

The lower electrically conductive film (lower electrode) 11 is formed on a suitable semiconductor substrate (not shown), such as a silicon substrate. The lower conductive film 11 may be made of any suitable electrically conductive material. Preferred examples include metal-based materials such as ruthenium (Ru), tungsten (W), aluminum (Al), platinum (Pt), tungsten nitride (WN), titanium nitride (TiN) and titanium silicon nitride (TiSiN), and semiconductor materials such as polysilicon doped with impurities. Most preferred materials for the lower conductive film are tungsten nitride and ruthenium. When the lower conductive film 11 is made of a metal-based material, a capacitor having a so-called MIM structure is obtained.

The lower conductive film 11 can be formed by any suitable vapor-phase deposition technique generally known in the art. However, when the capacitor is to be built in a semiconductor memory device having a complicated profile, it is preferable to form the lower conductive film ii by means of CVD. In the case of a semiconductor linear device, the lower conductive film 11 may also be formed by means of a PVD technique such as sputtering. The lower conductive film 11 normally has a thickness of 0.01 to 1.5 $\mu$m, preferably 0.02 to 0.1 $\mu$m.

The insulating film 12 made of an insulating film 12 composed of tantalum oxide ($Ta_2O_5$) is formed on the lower conductive film 11. The tantalum oxide film 12 can be formed by any suitable vapor-phase deposition technique generally known in the art, preferably CVD. More specifically, the tantalum oxide film 12 can be formed on the lower conductive film 11 by flowing pentaethoxytantalum ($Ta(OC_2H_5)_5$) at a flow rate of 1 to 1000 mg/min and oxygen at a flow rate of 0 to 5000 sccm, preferably 50 to 2000 sccm into a reaction chamber maintained at an internal pressure of 10 Pa to 1000 Pa, with an inert gas such as helium used as a carrier gas, and allowing the pentaethoxytantalum to decompose or react with the oxygen at a temperature of 300° C. to 600° C. The tantalum oxide film 12 normally has a thickness of 0.004 to 0.1 $\mu$m, preferably 0.005 to 0.04 $\mu$m.

After forming the tantalum oxide film 12, the film 12 is subjected to a predetermined treatment with active oxygen species and a predetermined annealing treatment according to the invention, as described in detail below, and then the upper conductive film 13 is formed on the film 12.

The upper conductive film (upper electrode) 13 may be made of any suitable electrically conductive material. Preferred examples thereof include metal-based materials such as ruthenium (R), aluminium (Al), platinum (Pt), tungsten nitride (WN), titanium nitride (TiN) and titanium silicon nitride (TiSiN). Most preferred materials for the upper conductive film are ruthenium, tungsten nitride and titanium silicon nitride.

The upper conductive film 13 can be formed by any suitable vapor-phase deposition technique generally known in the art. However, as in the case of the lower conductive film 11, when the capacitor is to be built in a semiconductor memory device having a complex profile, it is preferable to form the upper conductive film 13 by means of CVD. In the case of a semiconductor linear device, the upper conductive film 13 may be formed by means of a PVD technique such as sputtering. The upper conductive film 13 normally has a thickness of 0.01 to 0.2 $\mu$m, preferably 0.02 to 0.1 $\mu$m.

As described above, after forming the tantalum oxide film 12 by means of a vapor-phase deposition technique such as CVD, the film 12 is subjected to a predetermined treatment with active oxygen species and a predetermined annealing treatment before forming the upper conductive film 13 thereon.

The treatment with active oxygen species according to the invention is conducted to compensate for the oxygen deficiency of the tantalum oxide film 12 by incorporating oxygen species into the tantalum oxide film formed by vapor-phase deposition. The active oxygen species may comprise oxygen radicals, oxygen ions, etc. Such treatment with active oxygen species may be conducted in any suitable manner that can bring the tantalum oxide film 12 into contact with active oxygen species. For instance, the tantalum oxide film may be placed in an ozone atmosphere and the ozone may be irradiated with ultraviolet rays to generate active oxygen species that are contacted with the film. In another embodiment, a remote oxygen plasma treatment may be employed, in which oxygen plasma is generated from oxygen in an oxygen plasma generation chamber and introduced into a treatment chamber in which the substrate having the tantalum oxide film is placed whereby the tantalum oxide film is brought into contact with the oxygen plasma. In this case, nitrous oxide ($N_2O$) may also be used as an oxygen plasma source. Alternatively, the tantalum oxide film may be treated with active oxygen species by simply placing the tantalum oxide film in an ozone atmosphere. The treatment with active oxygen species is normally conducted at a temperature of 300° C. to 650° C., preferably 400° C. to 500° C. Further, the treatment with active oxygen species is usually conducted for 30 to 600 seconds, preferably for 60 to 120 seconds. Organic substances can be removed from the tantalum oxide film during the treatment with active oxygen species.

After forming the tantalum oxide film 12 by a vapor-phase deposition method such as CVD and before forming an upper conductive layer 13, the annealing treatment is conducted. The annealing treatment is carried out on the tantalum oxide film 12 in an inert atmosphere, preferably a nitrogen atmosphere, at a temperature lower than the crystallization temperature of tantalum oxide by 10° C. to 80° C., preferably by 20° C. to 50° C., more preferably by 30° C. to 50° C. Preferably the annealing is carried out at a temperature of 620 to 690° C., more preferably at 650° C. to 680° C., most preferably 650° C. to 670° C. This annealing treatment densities the tantalum oxide film 12, improving the film quality, while suppressing the oxidation of the lower conductive film 11 to a minimal level. Also the tantalum oxide film is partially crystallized as a result of the annealing treatment. In other words, while the annealed tantalum oxide is mostly amorphous, it also contains crystals of the oxide. The annealing treatment is conducted normally for 30 to 300 seconds, preferably for 60 to 180 seconds. Any suitable technique known in the art may be employed to effect the annealing treatment, such as lamp annealing or in-furnace annealing. Incidentally, the crystallization temperature of the tantalum oxide is about 700° C., when the tantalum oxide is formed on the metal-based lower conductive film.

FIG. 5 shows is a graph showing X-ray diffraction measurement made on tantalum oxide annealed at different temperatures, i.e., at 610° C., 620° C., 680° C., and 700° C. It is seen from FIG. 5 that the crystals of tantalum oxide begin to be formed at about 620° C., and tantalum oxide film is completely crystallized at 700° C. Thus, the annealing temperature of the invention, which is 10 to 80° C. lower than the crystallization temperature of tantalum oxide, anneals tantalum oxide without completely crystallizing the tantalum oxide, and improves the quality of the tantalum oxide film.

The above-described treatment with active oxygen species may be conducted either one before the other. Thus, after forming the tantalum oxide film 12 on the lower conductive film 11, the tantalum oxide film 12 may be subjected to the treatment with active oxygen species first and then to the annealing treatment. Alternatively, after forming the tantalum oxide film 12 on the lower conductive film 11, the tantalum oxide film 12 may be subjected to the annealing treatment and then to the treatment with active oxygen species. However, the latter may be preferred. Since the tantalum oxide film is amorphous immediately after the film formation by means of CVD, active oxygen species can relatively easily pass therethrough to consequently oxidize the lower conductive film 11. When the tantalum oxide film is annealed first, it is densified to prevent active oxygen species from passing therethrough and reaching the lower conductive film 11. If the latter is selected, the effect of compensating for the oxygen deficiency of the tantalum oxide film by active oxygen species is not affected.

Figure 2:
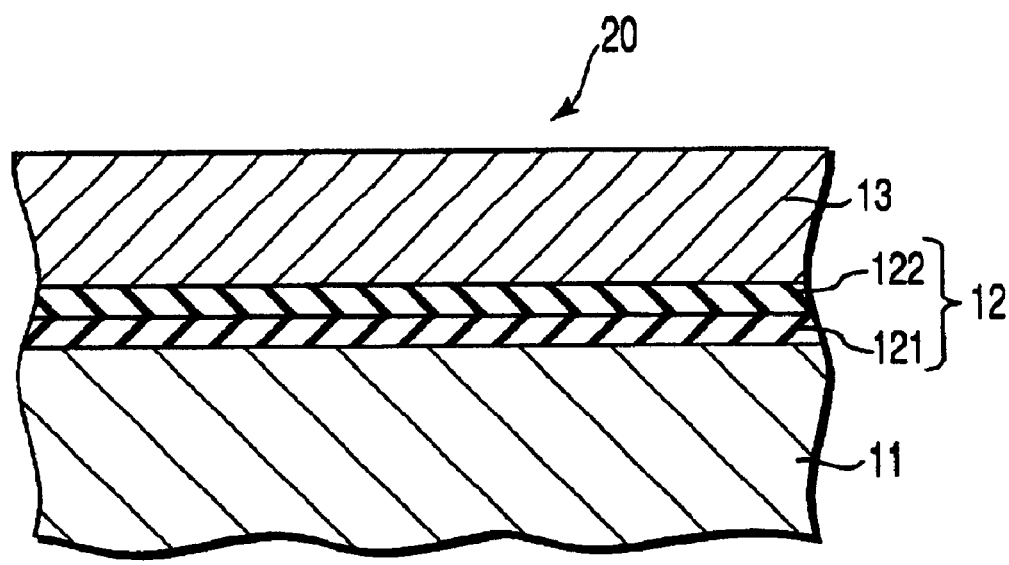
FIG. 2 is a schematic cross sectional view of another capacitor that can be manufactured by a method according to the invention.

FIG. 2 is a schematic cross sectional view of another capacitor that can be manufactured by a method according to the invention. Referring to FIG. 2, a capacitor 20 has the same structure as the capacitor 10 described with reference to FIG. 1, except that the tantalum oxide film 12 formed between the lower conductive film 11 and the upper conductive film 13 is of two-layered structure comprising a first tantalum oxide layer 121 and a second tantalum oxide layer 122. In this case, the first tantalum oxide layer 121 is formed in the same way as the tantalum oxide film 12 of the capacitor 10 described with reference to FIG. 1, and is annealed (a first annealing treatment) in a manner as described above with reference to FIG. 1. Then, the annealed layer 121 is subjected to a treatment with active oxygen species (a first treatment with active oxygen species) in a manner as described above with reference to FIG. 1. Subsequently, the second tantalum oxide layer 122 is formed on the first tantalum oxide layer 121 just like the tantalum oxide film 12 in a manner described above with reference to FIG. 1, and is treated with active oxygen species in a manner as described above with reference to FIG. 1. Thereafter, the layer 122 is annealed (a second annealing treatment). The second annealing treatment may be conducted at a temperature lower than the crystallization temperature of tantalum oxide by 10 to 80° C., preferably by 20 to 50° C., more preferably 30 to 50° C. and preferably at a temperature of 620 to and 690° C., more preferably 650 to 680° C., most preferably 650 to 670° C., like the first annealing treatment. However, as the first tantalum oxide layer 121 has been subjected to the first annealing treatment and thus densified, it may act as a barrier layer against oxygen species so that the second annealing treatment may be conducted at least at the crystallization temperature of tantalum oxide. When the second annealing treatment is conducted at the crystallization temperature of tantalum oxide or higher temperature, the second tantalum oxide layer 122 and consequently the first tantalum oxide layer 121 will be crystallized more sufficiently to maximally increase the dielectric constant. Thus, the second annealing treatment is conducted preferably at a temperature of 630 to 750° C. The second annealing treatment is conducted normally for 30 to 300 seconds, preferably for 60 to 180 seconds. Note that both the process of forming the second tantalum oxide layer 122 as well as the subsequent second treatment with active oxygen species and the second annealing treatment may be repeated twice or more than twice.

The present invention will now be described by way of Examples, but should not be limited thereto.

EXAMPLE 1

A tungsten nitride film was deposited on a silicon substrate to a thickness of 0.05 μm by CVD under the conditions as listed below. Then, a tantalum oxide film was deposited on the tungsten nitride film to a thickness of 0.01 μm also by CVD. The substrate having the tantalum oxide film was placed in a reaction chamber under ozone atmosphere and irradiated with ultraviolet rays at the temperature of 425° C. for 120 seconds to treat the tantalum oxide film with the generated active oxygen species. Subsequently, the tantalum oxide film was annealed at 650° C. for 60 seconds in a nitrogen atmosphere. Thereafter, a TiN film was formed on the tantalum oxide film to a thickness of 0.06 μm by CVD to produce the desired capacitor. The capacitor had a thickness of only 1.76 nm in terms of the oxide film. The tantalum oxide film exhibited a dielectric constant ∈ of 22.

<Conditions for Forming the Tungsten Nitride Film>
  Substrate temperature; 500° C.
  Reaction chamber internal pressure: 300 Pa
  $WF_6$ gas flow rate: 5 sccm
  $NH_3$ gas flow rate: 500 sccm <Conditions for Forming the Tantalum Oxide Film>
  Substrate temperature: 450° C.
  Reaction chamber internal pressure: 40 Pa
  Pentaethoxytantalum gas flow rate: 16.5 mg/min
  Oxygen gas flow rate: 1000 sccm
  He gas flow rate: 300 sccm

EXAMPLE 2

A desired capacitor was prepared in the same manner as in Example 1, except that a TiSiN film was formed by CVD under the conditions as listed below, instead of the tungsten nitride film. The capacitor had a thickness of only 1.34 nm in terms of the oxide film. The tantalum oxide film exhibited a dielectric constant ∈ of 29.

<Conditions for Forming the TiSiN Film>
  Substrate temperature: 300° C.–500° C.
  Gases used: $TiCl_4/SiH_4/N_2$

EXAMPLE 3

In the same manner as in Example 1, a tungsten nitride film and a tantalum oxide film (the thickness was 0.05 μm) were sequentially formed on a silicon substrate and the tantalum oxide film was treated with active oxygen species (conducted for 60 seconds) and annealed. Then, a second tantalum oxide film was deposited thereon to a thickness of 0.05 μm also by the similar CVD. Subsequently, the substrate having the tantalum oxide films were placed in a reaction chamber under an ozone atmosphere and irradiated with ultraviolet rays at a temperature of 425° C. for 60 seconds to treat the second tantalum oxide film with the generated active oxygen species. Subsequently, a second annealing treatment was conducted at 700° C. for 60 seconds in a nitrogen atmosphere. Thereafter, an upper conductive film was formed on the second tantalum oxide film as in Example 1 to produce a desired capacitor. The capacitor had a thickness of only 1.39 nm in terms of the oxide film. The tantalum oxide film exhibited a dielectric constant ∈ of 28.

EXAMPLE 4

A desired capacitor was prepared in the same manner as in Example 3, except that, instead of tungsten nitride film, a TiSiN film was formed under the conditions as in Example 2. The capacitor had a thickness of only 1.47 nm in terms of the oxide film. The tantalum oxide film exhibited a dielectric constant ∈ of 26.

Figure 3:
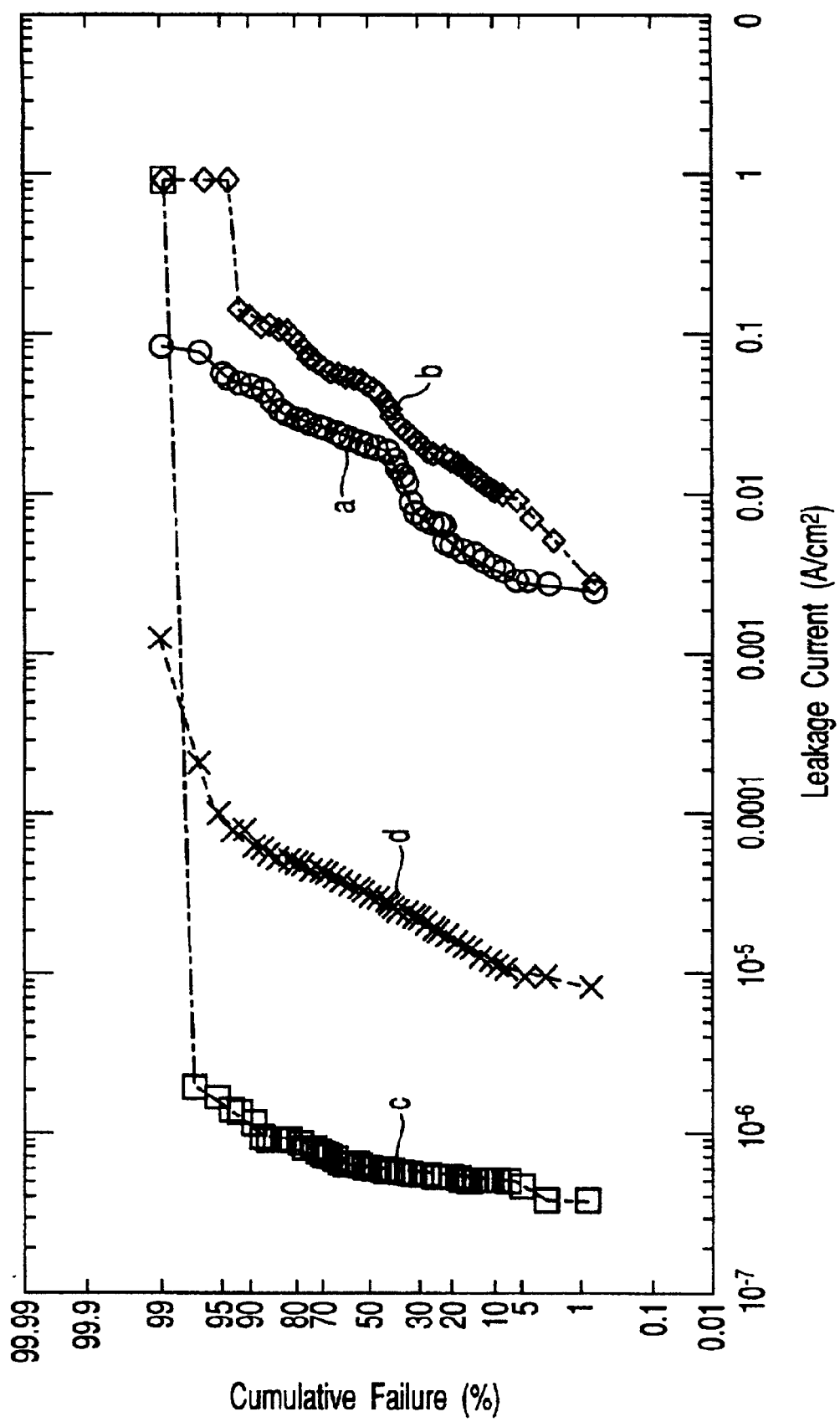
FIG. 3 is a graph illustrating the electric characteristics of several capacitors manufactured by a method according to the invention for comparison purpose.

The capacitors prepared in Examples 1 to 4 were tested for their electric characteristics (leakage current density) at a temperature of 90° C. with a plate voltage of +75V. FIG. 3 shows the obtained results. In FIG. 3, curve a shows the performance of the capacitor of Example 1 and curve b shows that of the capacitor of Example 2, while curves c and d respectively show the performance of the capacitor of Example 3 and that of the capacitor of Example 4. It will be appreciated from FIG. 3 that all the capacitors showed excellent electric characteristics with a very low leakage current density level. It will also be appreciated that, regardless of the material of the lower conductive film, the capacitor obtained by a method according to the invention shows better electric characteristics when more than one tantalum oxide films are formed for it and subsequently subjected to a treatment process using active oxygen species and an annealing treatment for more than once (as in Example 3 and 4) rather than when a single tantalum oxide film is formed for it and subsequently subjected to a treatment process using active oxygen species and an annealing treatment only for once (as in Examples 1 and 2).

EXAMPLE 5

Figure 4:
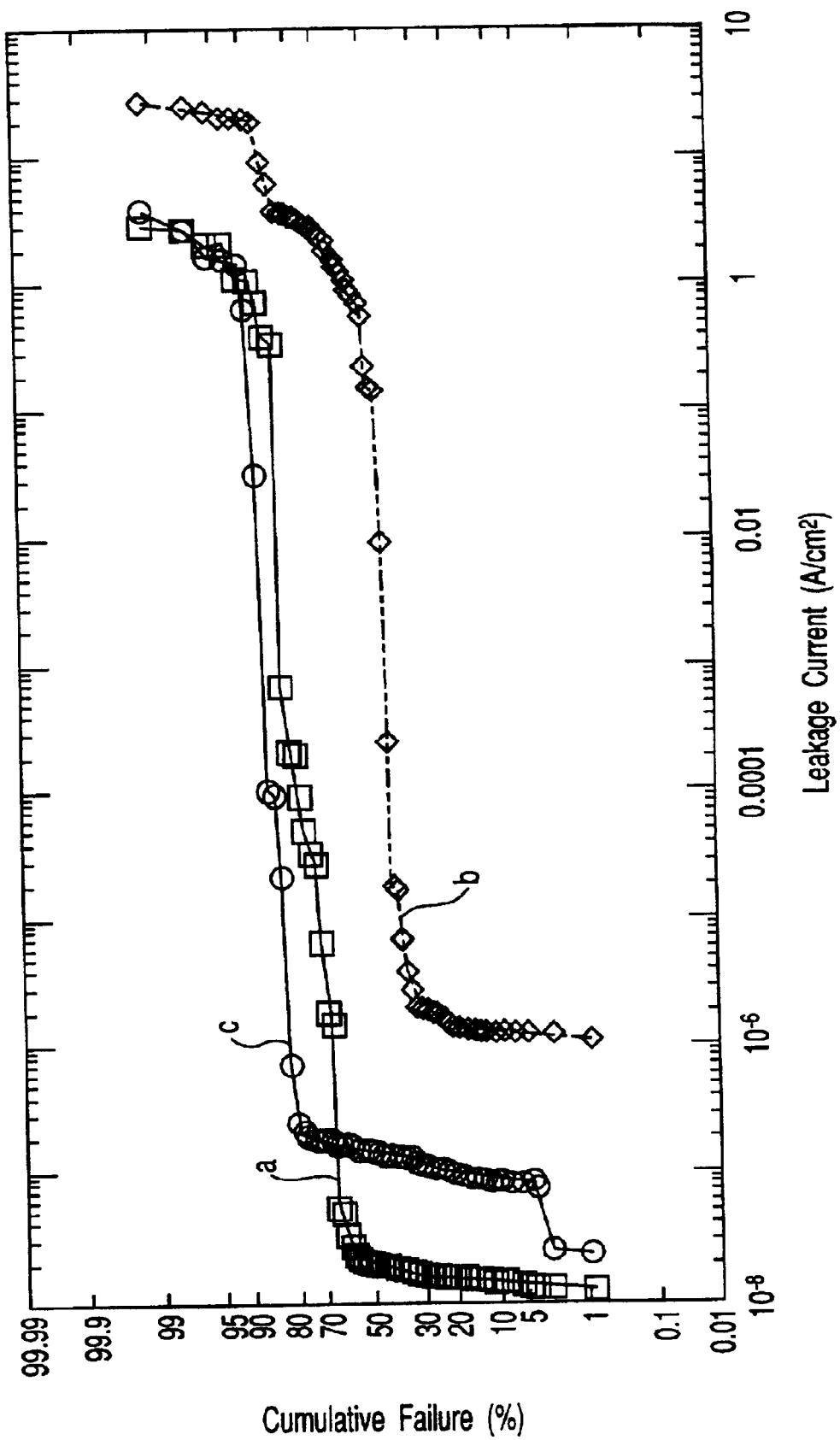
FIG. 4 is a graph illustrating the electric characteristics of some capacitors manufactured by a method according to the invention and those of a comparative capacitor.

A ruthenium film was formed on a silicon substrate to a thickness of 0.05 μm by vacuum evaporation. Then, a 0.01 μm thick tantalum oxide film was deposited on the ruthenium film by using the technique described above for Example 1. The substrate having the tantalum oxide film was placed in a reaction chamber under an ozone atmosphere and irradiated with ultraviolet rays at a temperature of 425° C. for 120 seconds to treat the tantalum oxide film with the generated active oxygen species. Subsequently, the tantalum oxide film was annealed at 650° C.(the invention) or 700° C. (Comparative Example A) for 60 seconds in a nitrogen atmosphere. Thereafter, a TiN film was formed on the tantalum oxide film to a thickness of 0.06 μm by CVD to produce a capacitor. The capacitor of Examples 1 and that of Comparative Example A were tested for their electric characteristics (leakage current density) at temperature of 90° C. with a plate voltage of +75V. FIG. 4 shows the obtained results. In FIG. 4, curve a shows the performance of the capacitor of Example 5 that was annealed at 650° C. and curve b shows that of the capacitor of Comparative Example A that was annealed at 700° C. Curve c shows the performance of the capacitor that was not subjected to any annealing treatment (Comparative Example B). It will be appreciated from FIG. 4 that a capacitor annealed at a temperature sufficiently lower than the crystallization temperature of tantalum oxide (curve a) shows electric characteristics much better than a capacitor annealed at 700° C. (Comparative Example A, curve b) and a capacitor that is not annealed (Comparative Example B, curve c).

As described above in detail, according to the invention, it is now possible to manufacture a capacitor that can effectively suppress the possible oxidation of the lower electrode and improve the film quality of the tantalum oxide film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a capacitor having a tantalum oxide film as an insulating film, said method comprising:

vapor-phase depositing a tantalum oxide film on a lower electrode comprising a ruthenium film;

treating the tantalum oxide film at a temperature of 300 to 500° C. in an atmosphere of active oxygen species;

then immediate annealing the tantalum oxide film treated with the active oxygen species, at a temperature of 620 to 690° C., which temperature is lower than a crystallization temperature of tantalum oxide, in an inert atmosphere; and forming an upper electrically conductive film on the annealed tantalum oxide film.

2. A method of manufacturing a capacitor having a tantalum oxide film as an insulating film, said method comprising:

vapor-phase depositing a tantalum oxide film on a lower electrode comprising a ruthenium film;

annealing the tantalum oxide film at a temperature of 620 to 690° C., which temperature is lower than a crystallization temperature of tantalum oxide, in an inert atmosphere;

treating the annealed tantalum oxide film at a temperature of 300 to 650° C. in an atmosphere of active oxygen species; and forming an upper electrically conductive film on the tantalum oxide film treated with the active oxygen species.

3. A method of manufacturing a capacitor having a tantalum oxide film as insulating film, said method comprising:

a first vapor-phase deposition step of vapor-phase depositing a first tantalum oxide film on a lower electrode;

a first annealing step of annealing the first tantalum oxide film at a temperature of 620 to 690° C., which temperature is lower than a crystallization temperature of tantalum oxide, in an inert atmosphere;

a first treatment step of treating the annealed first tantalum oxide film at a temperature of 300 to 650° C. in an atmosphere of active oxygen species;

a second vapor-phase deposition step of vapor-phase depositing a second tantalum oxide film on the first tantalum oxide film treated with the active oxygen species;

a second treatment step of treating the second tantalum oxide film at a temperature of 300 to 650° C. in an atmosphere of active oxygen species;

a second annealing step of annealing the second tantalum oxide film treated with the active oxygen species, at a temperature of 630 to 750° C., in an inert atmosphere; and a step of forming an upper electrically conductive film on the annealed second tantalum oxide film.

4. The method according to claim 3, wherein said lower electrode is formed of a metal-based electrically conductive material.

5. The method according to claim 4, wherein said metal-based material is a member selected from ruthenium, platinum, tungsten nitride, and titanium silicon nitride.

6. The method according to claim 3, wherein said step of forming the second tantalum oxide film, said second treatment with active species and said second annealing step are conducted sequentially at least once, before the formation of the upper conductive film.

7. The method according to claim 1, wherein the active oxygen species are generated by irradiating an ozone atmosphere with ultraviolet rays, by a remote oxygen plasma method, or by a remote $N_2O$ plasma method.

8. The method according to claim 1, wherein the tantalum oxide film is treated in the atmosphere of active oxygen species at a temperature of 400 to 500° C.

9. The method according to claim 2, wherein the active oxygen species are generated by irradiating an ozone atmosphere with ultraviolet rays, by a remote oxygen plasma method, or by a remote $N_2O$ plasma method.

10. The method according to claims 2, wherein the tantalum oxide film is treated in the atmosphere of active oxygen species at a temperature of 400 to 500° C.

11. The method according to claim 3, wherein the active oxygen species are generated by irradiating an ozone atmosphere with ultraviolet rays, by a remote oxygen plasma method, or by a remote $N_2O$ plasma method.

12. A method of manufacturing a capacitor having an insulating film comprising a metal oxide, said method comprising:

a step of forming a lower electrode comprising a metal-based material on a substrate;

a step of forming a tantalum oxide film on the lower electrode;

a first annealing treatment step of treating the substrate on which the tantalum oxide film has been formed, at a temperature of about 620° C. to about 690° C., which temperature is lower than a crystallization temperature of tantalum oxide, in an inert atmosphere;

a second annealing treatment step of treating the substrate on which the tantalum oxide film has been formed, at a temperature of 300 to 690° C. in an atmosphere of active oxygen species; and a step of forming an upper electrode on the annealed tantalum oxide film.

13. The method according to claim 12, wherein the metal-based material is a member selected from the group consisting of tungsten nitride, titanium silicon nitride and platinum.

14. The method according to claim 12, wherein the second annealing treatment step is conducted at a temperature of 400 to 500° C.

15. The method according to claim 13, wherein the second annealing step is conducted after the first annealing step, and then the step of forming the upper electrode is conducted.

16. The method according to claim 12, wherein the active oxygen species are generated by irradiating an ozone atmosphere with ultraviolet rays, by a remote oxygen plasma method, or by a remote $N_2O$ plasma method.

* * * * *